United States Patent
Wang et al.

(10) Patent No.: US 12,413,240 B2
(45) Date of Patent: Sep. 9, 2025

(54) TEMPERATURE SENSING DEVICE AND TEMPERATURE SENSING METHOD

(71) Applicants: Global Unichip Corporation, Hsinchu (TW); Taiwan Semiconductor Manufacturing Company, Ltd., Hsinchu (TW)

(72) Inventors: Ting-Hao Wang, Hsinchu (TW); Jun-Wan Wu, Hsinchu (TW); Pei-Ju Lin, Hsinchu (TW)

(73) Assignees: Global Unichip Corporation, Hsinchu (TW); Taiwan Semiconductor Manufacturing Company, Ltd., Hsinchu (TW)

( * ) Notice: Subject to any disclaimer, the term of this patent is extended or adjusted under 35 U.S.C. 154(b) by 487 days.

(21) Appl. No.: 18/152,785

(22) Filed: Jan. 11, 2023

(65) Prior Publication Data
US 2024/0210252 A1 Jun. 27, 2024

(30) Foreign Application Priority Data
Dec. 21, 2022 (TW) .................................. 111149090

(51) Int. Cl.
| H03M 1/12 | (2006.01) |
| G01K 7/01 | (2006.01) |
| G01K 3/00 | (2006.01) |
| G01K 7/16 | (2006.01) |

(52) U.S. Cl.
CPC ................ *H03M 1/12* (2013.01); *G01K 7/01* (2013.01); *G01K 3/00* (2013.01); *G01K 3/005* (2013.01); *G01K 7/16* (2013.01)

(58) Field of Classification Search
CPC .. H03M 1/12; G01K 7/01; G01K 7/16; G01K 3/00; G01K 3/005
See application file for complete search history.

(56) References Cited

U.S. PATENT DOCUMENTS

2020/0103436 A1* 4/2020 Hanson .................. G01P 21/00

* cited by examiner

*Primary Examiner* — Joseph J Lauture
(74) *Attorney, Agent, or Firm* — JCIPRNET

(57) ABSTRACT

A temperature sensing device and a temperature sensing method are provided. The temperature sensing device includes a sensor and a conversion circuit. The sensor generates a first sensing signal and a second sensing signal corresponding to a temperature based on different conditions. The conversion circuit performs a subtraction operation on the first sensing signal and the second sensing signal to obtain a result difference value, calculates a compensation value according to the result difference value and the first sensing signal, multiplies the result difference value and the compensation value to obtain a multiplication value, subtracts the multiplication value from the first sensing signal to generate a first value, adds the multiplication value to the first sensing signal to generate a second value, and divides the first value by the second value to generate an output value. The second value is a constant.

12 Claims, 5 Drawing Sheets

TEMPERATURE SENSING DEVICE AND TEMPERATURE SENSING METHOD

CROSS-REFERENCE TO RELATED APPLICATION

This application claims the priority benefit of Taiwan application serial no. 111149090, filed on Dec. 21, 2022. The entirety of the above-mentioned patent application is hereby incorporated by reference herein and made a part of this specification.

BACKGROUND OF THE INVENTION

Field of the Invention

The invention relates to a sensing device and a sensing method, and in particular to a temperature sensing device and a temperature sensing method.

Description of Related Art

Generally, a temperature sensing device senses temperature via a sensor, so as to generate at least one sensing signal corresponding to the temperature. And the sensing signal is converted to an output digital code value via a conversion circuit. The conversion circuit reduces the error caused by the voltage variation of the power supply using the division operation or subtraction operation of two sensing signals. However, the two sensing signals are both variables, thus significantly reducing the sensing linearity of the temperature sensing device.

SUMMARY OF THE INVENTION

The invention provides a temperature sensing device and a temperature sensing method having high sensing linearity.

A temperature sensing device of the invention includes a sensor and a conversion circuit. The sensor generates a first sensing signal corresponding to a temperature based on a first condition, and generates a second sensing signal corresponding to the temperature based on a second condition different from the first condition. The first sensing signal is different from the second sensing signal. The conversion circuit is coupled to the sensor. The conversion circuit performs a subtraction operation on the first sensing signal and the second sensing signal to obtain a result difference value, calculates a compensation value according to the result difference value and the first sensing signal, multiplies the result difference value and the compensation value to obtain a multiplication value, subtracts the multiplication value from the first sensing signal to generate a first value, adds the multiplication value to the first sensing signal to generate a second value, divides the first value by the second value to generate an output value, and converts the output value to an output digital code value. The second value is a constant.

A temperature sensing method of the invention includes: generating a first sensing signal corresponding to a temperature based on a first condition via a sensor, and generating a second sensing signal corresponding to the temperature based on a second condition different from the first condition, wherein the first sensing signal is different from the second sensing signal; performing a subtraction operation on the first sensing signal and the second sensing signal via a conversion circuit to obtain a result difference value; calculating a compensation value according to the result difference value and the first sensing signal via the conversion circuit; and performing a multiplication operation on the result difference value and the compensation value to obtain a multiplication value, subtracting the multiplication value from the first sensing signal to generate a first value, adding the multiplication value to the first sensing signal to generate a second value, dividing the first value by the second value to generate an output value, and converting the output value to an output digital code value. The second value is a constant.

Based on the above, the conversion circuit performs the multiplication operation on the result difference value and the compensation value to obtain the multiplication value, subtracts the multiplication value from the first sensing signal to generate the first value, adds the multiplication value to the first sensing signal to generate the second value, and divides the first value by the second value to generate the output value. It should be noted that the second value is a constant. In this way, the temperature sensing device has high sensing linearity.

In order to make the aforementioned features and advantages of the disclosure more comprehensible, embodiments accompanied with figures are described in detail below.

DESCRIPTION OF THE EMBODIMENTS

Figure 1:
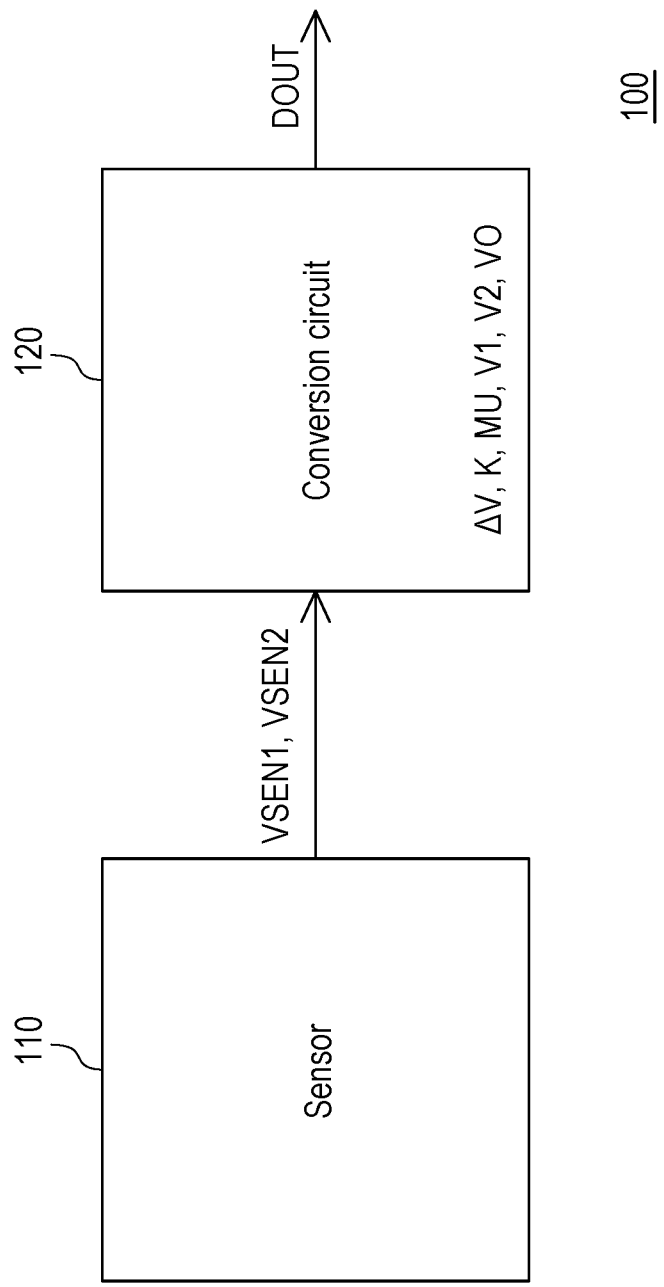
FIG. 1 is a schematic diagram of a temperature sensing device shown according to an embodiment of the invention.

A portion of the embodiments of the invention is described in detail hereinafter with reference to figures. In the following, the same reference numerals in different figures should be considered to represent the same or similar elements. These embodiments are only a portion of the disclosure and do not disclose all of the possible implementations of the disclosure. More precisely, these embodiments are only examples in the claims of the invention.

Referring to FIG. 1, FIG. 1 is a schematic diagram of a temperature sensing device shown according to an embodiment of the invention. In the present embodiment, a temperature sensing device 100 includes a sensor 110 and a conversion circuit 120. The sensor 110 generates a first sensing signal VSEN1 corresponding to a temperature based on a first condition, and generates a second sensing signal VSEN2 corresponding to the temperature based on a second condition.

In the present embodiment, the first condition is different from the second condition. Therefore, the first sensing signal VSEN1 is different from the second sensing signal VSEN2. The first condition and the second condition are respectively a first sensing sensitivity and a second sensing sensitivity of the sensor 110. The first sensing sensitivity of the sensor 110 is designed to be different from the second sensing sensitivity. In the present embodiment, the sensing sensitivity of the first condition is designed to be higher than the sensing sensitivity of the second condition.

Taking the present embodiment as an example, the first sensing signal VSEN1 and the second sensing signal VSEN2 are analog voltage signals respectively, and the invention is not limited thereto. In some embodiments, the first sensing signal VSEN1 and the second sensing signal VSEN2 are analog current signals respectively.

In the present embodiment, the conversion circuit 120 is coupled to the sensor 110. The conversion circuit 120 receives the first sensing signal VSEN1 and the second sensing signal VSEN2 from the sensor 110. The conversion circuit 120 performs a subtraction operation on the first sensing signal VSEN1 and the second sensing signal VSEN2 to obtain a result difference value ΔV. The conversion circuit 120 calculates a compensation value K according to the result difference value ΔV and the first sensing signal VSEN1. The compensation value K is related to the temperature or is constant. The conversion circuit 120 multiplies the result difference value ΔV and the compensation value K to obtain a multiplication value MU. The compensation value K is related to the temperature. The conversion circuit 120 subtracts the multiplication value MU from the first sensing signal VSEN1 to generate a first value V1, adds the multiplication value MU to the first sensing signal VSEN1 to generate a second value V2, and divides the first value V1 by the second value V2 to generate an output value VO. The second value V2 is a constant. The conversion circuit 120 converts the output value VO into an output digital code value DOUT.

It should be mentioned here that, the conversion circuit 120 performs a multiplication operation on the result difference value ΔV between the first sensing signal VSEN1 and the second sensing signal VSEN2 and the compensation value K to obtain the multiplication value MU, subtracts the multiplication value MU from the first sensing signal VSEN1 to generate the first value V1, adds the multiplication value MU to the first sensing signal VSEN1 to generate the second value V2, and divides the first value V1 by the second value V2 to generate the output value VO. It should be noted that the second value V2 is a constant. The second value V2 (i.e., the denominator) is not changed based on the change of the temperature. In this way, the temperature sensing device 100 has high sensing linearity.

In some embodiments, the conversion circuit 120 may obtain the compensation value K during the test stage or when used for the first time, and store the relationship between the compensation value K and the temperature. Therefore, the conversion circuit 120 does not need to recalculate the compensation value K every time the conversion circuit 120 is used. In some embodiments, the conversion circuit 120 may obtain the relationship between the multiplication value MU and the temperature during the test stage or when used for the first time, and store the relationship between the multiplication value MU and the temperature. Therefore, the conversion circuit 120 does not need to recalculate the multiplication value MU every time the conversion circuit 120 is used.

Figure 2:
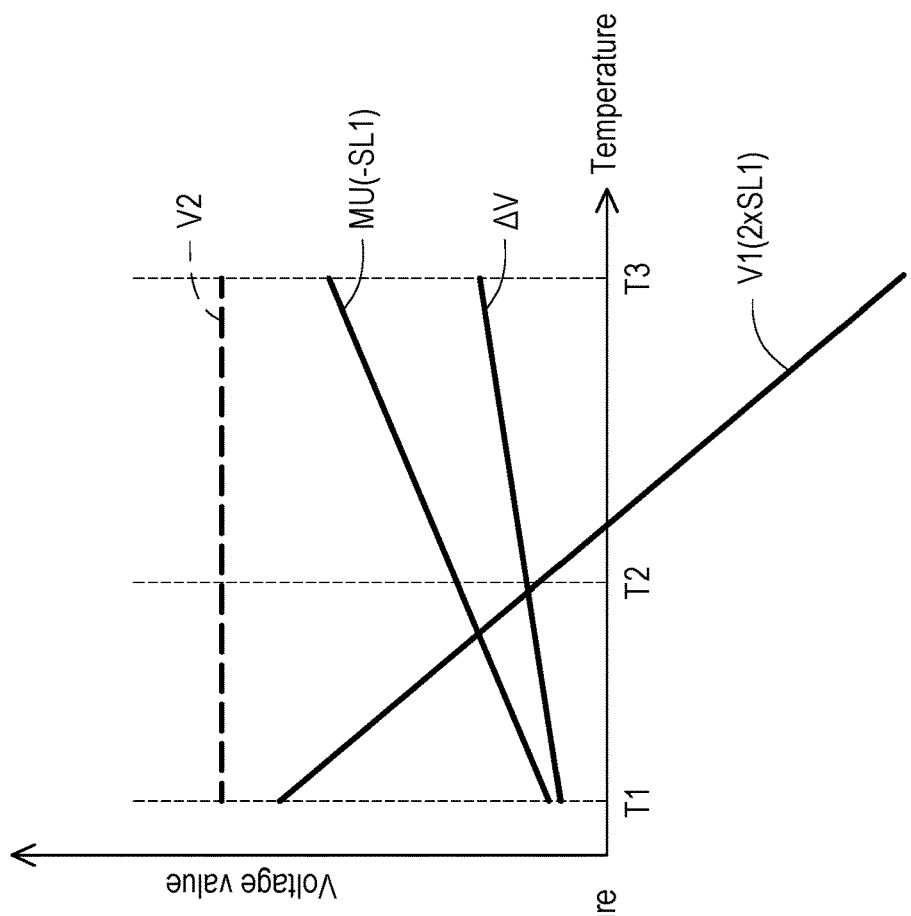
FIG. 2 is a schematic diagram of the relationship between signal and temperature shown according to an embodiment of the invention.
Figure 2:
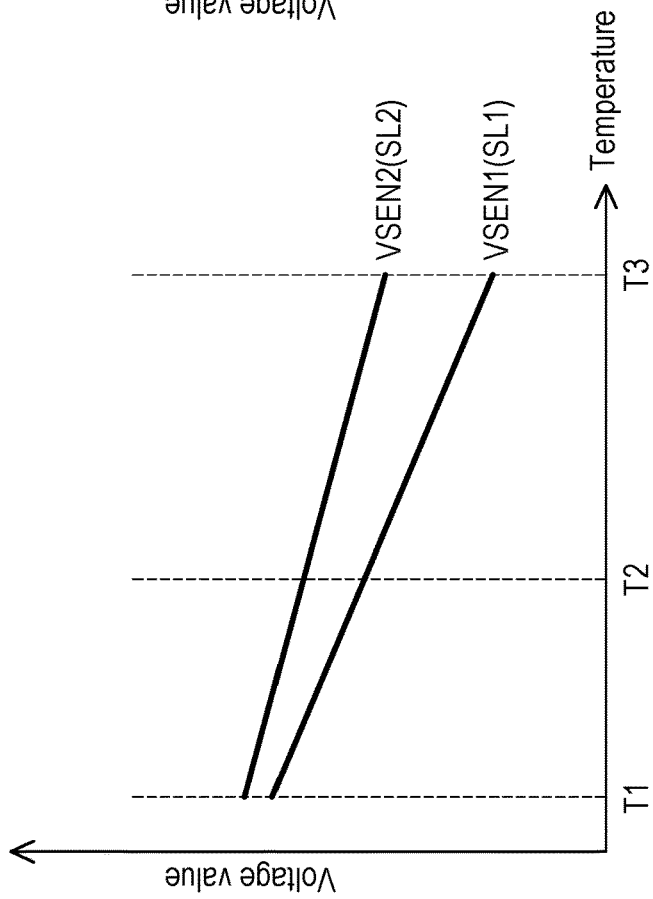

For specific description, please refer to FIG. 1 and FIG. 2 at the same time. FIG. 2 is a schematic diagram of the relationship between signal and temperature shown according to an embodiment of the invention. FIG. 2 shows a schematic diagram of the relationship between the first sensing signal VSEN1, the second sensing signal VSEN2, the result difference value ΔV, the first value V1, the second value V2, and the multiplication value MU and temperature.

In the present embodiment, the conversion circuit 120 performs a subtraction operation on the first sensing signal VSEN1 and the second sensing signal VSEN2 to obtain the result difference value ΔV. In the present embodiment, the conversion circuit 120 subtracts the first sensing signal VSEN1 from the second sensing signal VSEN2 to obtain the result difference value ΔV. In the present embodiment, at a temperature T1, a difference corresponding to the temperature T1 is generated between the second sensing signal VSEN2 and the first sensing signal VSEN1. At a temperature T2, a difference corresponding to the temperature T2 is generated between the second sensing signal VSEN2 and the first sensing signal VSEN1. At a temperature T3, a difference corresponding to the temperature T3 is generated between the second sensing signal VSEN2 and the first sensing signal VSEN1. The differences corresponding to the temperatures T1, T2, T3 are different from each other. Taking the present embodiment as an example, the temperature T3 is greater than the temperature T2. The temperature T2 is greater than the temperature T1. The result difference value ΔV corresponding to the temperature T3 is greater than the result difference value ΔV corresponding to the temperature T2. The result difference value ΔV corresponding to the temperature T2 is greater than the result difference value ΔV corresponding to the temperature T1.

The first sensing signal VSEN1 has a slope SL1 corresponding to the temperature. The second sensing signal VSEN2 has a slope SL2 corresponding to the temperature. The slopes SL1 and SL2 are negative values, respectively. The absolute value of the slope SL1 is greater than the absolute value of the slope SL2. This means that the sensing sensitivity of the first condition is higher than the sensing sensitivity of the second condition. Consequently, the result difference value ΔV is increased with increasing temperature.

The conversion circuit 120 performs a multiplication operation on the result difference value ΔV between the second sensing signal VSEN2 and the first sensing signal VSEN1 and the compensation value K to obtain the multiplication value MU (i.e., MU=K*ΔV). The multiplication value MU has an operation slope corresponding to the temperature. The operation slope is the negative value of the slope SL1 (i.e., "−SL1"). The conversion circuit 120 adds the multiplication value MU to the first sensing signal VSEN1 to generate the second value V2. Therefore, the second value V2 is a constant.

In the present embodiment, the conversion circuit 120 obtains the output value VO according to Equation (1).

$$VO = \frac{V1}{V2} = \frac{VS1 - MU}{VS1 + MU} = \frac{VS1 - K \times \Delta V}{VS1 + K \times \Delta V} \qquad \text{Equation (1)}$$

VS1 is the signal value of the first sensing signal VSEN1.
Assuming that the second value V2 is a constant value C, the conversion circuit 120 obtains the compensation value K according to Equations (2) and (3).

$$C = VS1 + K \times \Delta V \qquad \text{Equation (2)}$$

$$K = \frac{C - VS1}{\Delta V} \qquad \text{Equation (3)}$$

In other words, the conversion circuit 120 subtracts the first sensing signal VSEN1 from the constant value C to obtain a reference difference value, and divides the reference difference value by the result difference value ΔV to obtain the compensation value K. The constant value C may be any real number not equal to "0". For example, the constant value C may be "1", and the invention is not limited thereto.

Therefore, the output value VO is expressed as shown in Equation (4).

$$VO = \frac{VS1 - K \times \Delta V}{VS1 + K \times \Delta V} = \frac{2 \times VS1 - C}{C} \qquad \text{Equation (4)}$$

It should be noted that the operation slope of the multiplication value MU is the negative value of the slope SL1. The first value V1 is substantially equal to twice the slope SL1 of the first sensing signal VSEN1 (i.e., "−2*SL1"). The second value V2 is a constant. Therefore, the sensitivity of the output value VO is substantially equal to twice the first sensing sensitivity.

Figure 3:
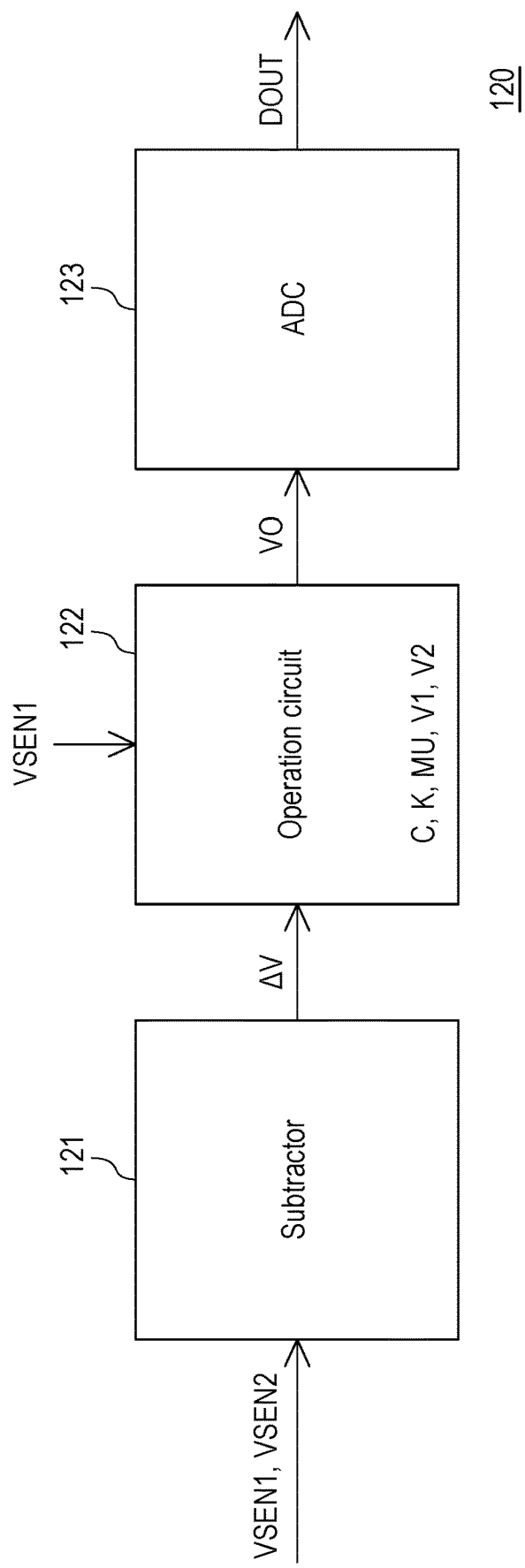
FIG. 3 is a schematic circuit diagram of a conversion circuit shown according to an embodiment of the invention.

Referring to FIG. 3, FIG. 3 is a schematic circuit diagram of a conversion circuit shown according to an embodiment of the invention. In the present embodiment, the conversion circuit 120 includes a subtractor 121, an operation circuit 122, and an analog-to-digital converter (ADC) 123. The subtractor 121 receives the first sensing signal VSEN1 and the second sensing signal VSEN2. The subtractor 121 subtracts the first sensing signal VSEN1 from the second sensing signal VSEN2 to generate the result difference value ΔV. The operation circuit 122 is coupled to the subtractor 121. The operation circuit 122 receives the first sensing signal VSEN1 and the result difference value ΔV. Based on Equation (3), the operation circuit 122 calculates the compensation value K according to the result difference value ΔV and the first sensing signal VSEN1. The operation circuit 122 multiplies the result difference value ΔV and the compensation value K to obtain the multiplication value MU. Moreover, based on Equation (1), the operation circuit 122 subtracts the multiplication value MU from the first sensing signal VSEN1 to generate the first value V1, adds the multiplication value MU to the first sensing signal VSEN1 to generate the second value V2, and divides the first value V1 by the second value V2 to generate the output value VO. The ADC 123 receives the output value VO, and converts the output value VO to the output digital code value DOUT.

Figure 4:
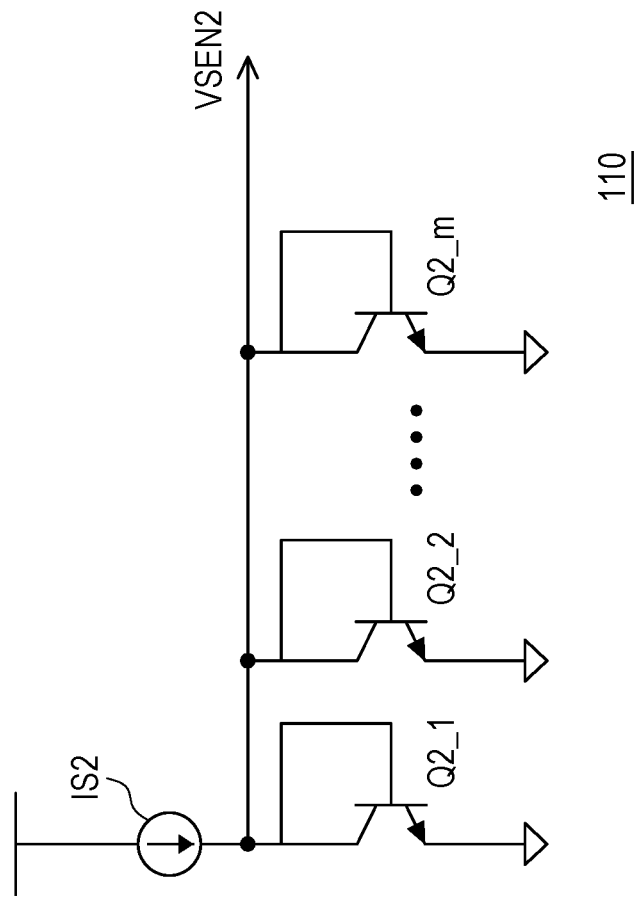
FIG. 4 is a schematic circuit diagram of a sensor shown according to an embodiment of the invention.
Figure 4:
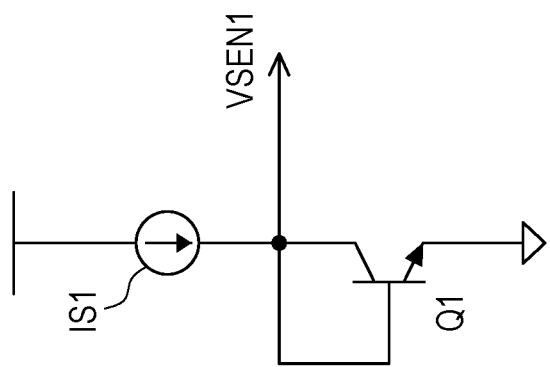

Please refer to both FIG. 1 and FIG. 4. FIG. 4 is a schematic circuit diagram of a sensor shown according to an embodiment of the invention. In the present embodiment, the sensor 110 includes a first current source IS1 and a first bipolar transistor Q1. The base of the first bipolar transistor Q1 is coupled to the collector of the first bipolar transistor Q1, the conversion circuit 120, and the first current source IS1. The emitter of the first bipolar transistor Q1 is coupled to a reference low potential (such as ground). In the present embodiment, the sensor 110 may provide the first condition via the configuration of the first current source IS1 and the first bipolar transistor Q1. The base and the collector of the first bipolar transistor Q1 are jointly used as a first output terminal of the sensor 110. The sensor 110 provides the first sensing signal VSEN1 to the conversion circuit 120 via the first output terminal. The first bipolar transistor Q1 of the present embodiment is implemented by an NPN bipolar transistor.

In some embodiments, the first bipolar transistor Q1 may be replaced by a diode. For example, the anode of the diode is coupled to the first current source IS1 and the conversion circuit 120. The anode of the diode is used as the first output terminal of the sensor 110. The cathode of the diode is coupled to the reference low potential.

In some embodiments, the first bipolar transistor Q1 may be replaced by any type of N-type field-effect transistor. For example, the gate of the N-type field-effect transistor is coupled to the drain of the N-type field-effect transistor, the first current source IS1, and the conversion circuit 120. The gate and the drain of the N-type field-effect transistor are collectively used as the first output terminal of the sensor 110. The source of the N-type field-effect transistor is coupled to the reference low potential.

In the present embodiment, the sensor 110 further includes a second current source IS2 and second bipolar transistors Q2_1 to Q2_m. The base of the second bipolar transistor Q2_1 is coupled to the collector of the second bipolar transistor Q2_1, the conversion circuit 120, and the second current source IS2. The emitter of the second bipolar transistor Q2_1 is coupled to the reference low potential. The base of the second bipolar transistor Q2_2 is coupled to the collector of the second bipolar transistor Q2_2, the conversion circuit 120, and the second current source IS2. The emitter of the second bipolar transistor Q2_2 is coupled to the reference low potential, and so on. In other words, the second bipolar transistors Q2_1 to Q2_m are respectively connected in a diode-connected manner, and are connected in parallel with each other. In the present embodiment, the sensor 110 may provide a second condition different from the first condition via the configuration of the second current source IS2 and the second bipolar transistors Q2_1 to Q2_m.

The bases and the collectors of the second bipolar transistors Q2_1 to Q2_m are jointly used as a second output terminal of the sensor 110. The sensor 110 provides the second sensing signal VSEN2 to the conversion circuit 120 via the second output terminal. The second bipolar transistors Q2_1 to Q2_m of the present embodiment are respectively implemented by an NPN bipolar transistor.

In the present embodiment, the current value provided by the first current source IS1 may be greater than the current value provided by the second current source IS2. As a result, the change amount of the first sensing signal VSEN1 is greater than the change amount of the second sensing signal VSEN2, so as to improve the recognition effect of a temperature sensing device 200 on the temperatures T1, T2, T3.

In some embodiments, the second bipolar transistors Q2_1 to Q2_m may be replaced by diodes respectively. For example, the anodes of the plurality of diodes are commonly coupled to the first current source IS1 and the conversion circuit 120. The anodes of the plurality of diodes are collectively used as the second output terminal of the sensor 110. The cathodes of the plurality of diodes are commonly coupled to the reference low potential.

In some embodiments, the second bipolar transistors Q2_1 to Q2_m may respectively be replaced by N-type field-effect transistors in any form. For example, the gates of the plurality of N-type field-effect transistors are respectively coupled to the drains of the plurality of N-type field-effect transistors, the first current source IS1, and the conversion circuit 120. The gates and the drains of the plurality of N-type field-effect transistors are collectively used as the second output terminal of the sensor 110. The sources of the plurality of N-type field-effect transistors are coupled to the reference low potential.

For ease of description, the quantity of the first bipolar transistor Q1 of the present embodiment is one as an example. The quantity of the first bipolar transistors of the invention may be a plurality, and the quantity of the first bipolar transistors is less than the quantity of the second bipolar transistors. The quantity of the first bipolar transistor of the invention is not limited to the present embodiment.

Figure 5:
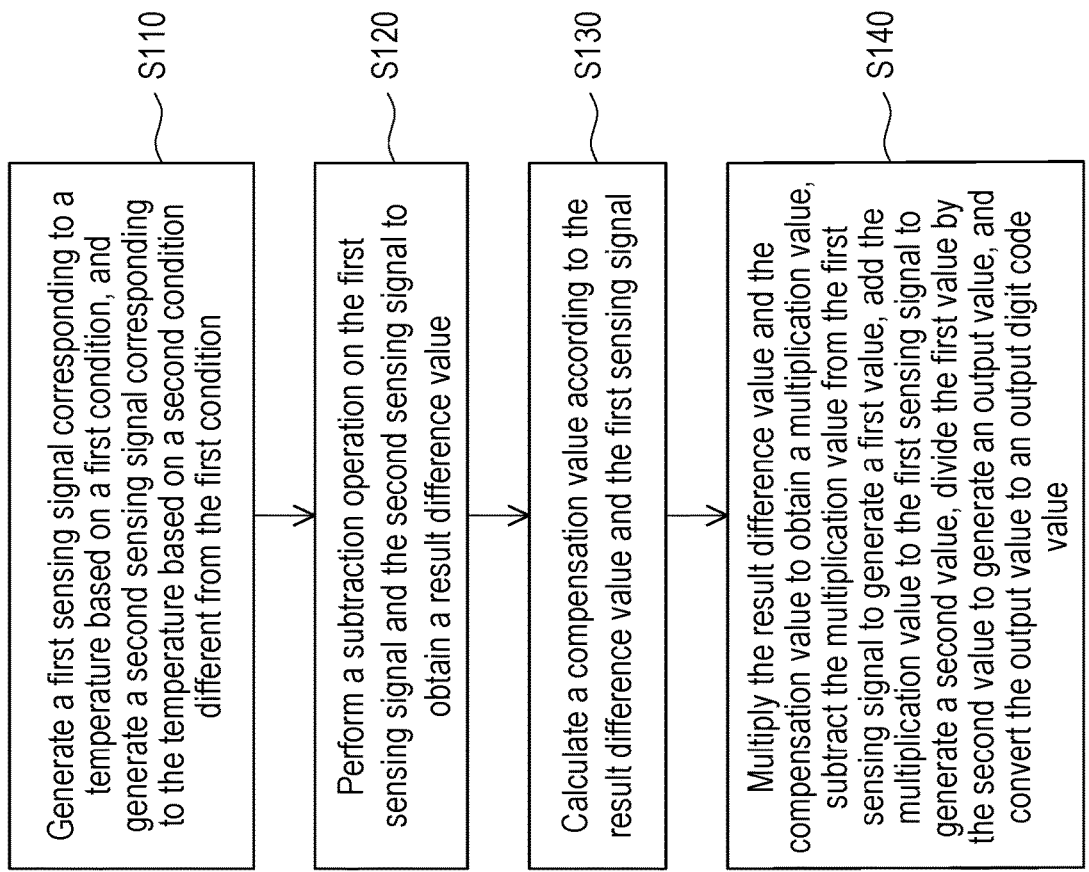
FIG. 5 is a flowchart of a temperature sensing method shown according to an embodiment of the invention.

Please refer to FIG. 1 and FIG. 5 at the same time. FIG. 5 is a method flowchart of a temperature sensing method shown according to an embodiment of the invention. In step S110, the sensor 110 generates the first sensing signal VSEN1 corresponding to the temperature based on a first condition, and generates the second sensing signal VSEN2 corresponding to the temperature based on a second condition. In step S120, the conversion circuit 120 performs a subtraction operation on the first sensing signal VSEN1 and the second sensing signal VSEN2 to obtain the result difference value ΔV. In step S130, the conversion circuit 120 calculates the compensation value K according to the result difference value ΔV and the first sensing signal VSEN1.

In step S140, the conversion circuit 120 multiplies the result difference value ΔV and the compensation value K to obtain the multiplication value MU. The conversion circuit 120 subtracts the multiplication value MU from the first sensing signal VSEN1 to generate the first value V1, adds the multiplication value MU to the first sensing signal VSEN1 to generate the second value V2, and divides the first value V1 by the second value V2 to generate the output value VO. The second value V2 is a constant. Moreover, the conversion circuit 120 converts the output value VO into the output digital code value DOUT.

The implementation details of steps S110 to S140 are clearly described in the plurality of embodiments of FIG. 1 to FIG. 4, and are therefore not repeated herein.

Based on the above, the conversion circuit performs the multiplication operation on the result difference value and the compensation value to obtain the multiplication value, subtracts the multiplication value from the first sensing signal to generate the first value, adds the multiplication value to the first sensing signal to generate the second value, and divides the first value by the second value to generate the output value. The second value is a constant. In this way, the temperature sensing device has high sensing linearity. In addition, the sensing sensitivity of the temperature sensing device is increased.

Although the invention has been described with reference to the above embodiments, it will be apparent to one of ordinary skill in the art that modifications to the described embodiments may be made without departing from the spirit of the disclosure. Accordingly, the scope of the disclosure is defined by the attached claims not by the above detailed descriptions.

What is claimed is:

1. A temperature sensing device, comprising:
a sensor configured to generate a first sensing signal corresponding to a temperature based on a first condition, and generate a second sensing signal corresponding to the temperature based on a second condition different from the first condition, wherein the first sensing signal is different from the second sensing signal; and
a conversion circuit coupled to the sensor and configured to perform a subtraction operation on the first sensing signal and the second sensing signal to obtain a result difference value, calculate a compensation value according to the result difference value and the first sensing signal, multiply the result difference value and the compensation value to obtain a multiplication value, subtract the multiplication value from the first sensing signal to generate a first value, add the multiplication value to the first sensing signal to generate a second value, divide the first value by the second value to generate an output value, and convert the output value to an output digital code value,
wherein the second value is a constant.

2. The temperature sensing device of claim 1, wherein:
the first sensing signal has a first slope corresponding to the temperature,
the second sensing signal has a second slope corresponding to the temperature,
the first slope and the second slope are respectively negative values, and
an absolute value of the first slope is greater than an absolute value of the second slope.

3. The temperature sensing device of claim 2, wherein:
the multiplication value has an operation slope corresponding to the temperature, and
the operation slope is a negative value of the first slope.

4. The temperature sensing device of claim 1, wherein the conversion circuit subtracts the first sensing signal from the second sensing signal to obtain the result difference value.

5. The temperature sensing device of claim 4, wherein the conversion circuit subtracts the first sensing signal from the constant value to obtain a reference difference value, and the reference difference value is divided by the result difference value to obtain the compensation value.

6. The temperature sensing device of claim 1, wherein the sensor comprises:
a first current source;
a first bipolar transistor, wherein a base of the first bipolar transistor is coupled to a collector of the first bipolar transistor, the conversion circuit, and the first current source, and an emitter of the first bipolar transistor is coupled to a reference low potential;
a second current source; and
a plurality of second bipolar transistors, wherein the plurality of second bipolar transistors are connected in parallel with each other, bases of the plurality of second bipolar transistors are respectively coupled to collectors of the plurality of second bipolar transistors, the conversion circuit, and the second current source, and emitters of the plurality of second bipolar transistors are respectively coupled to the reference low potential.

7. The temperature sensing device of claim 6, wherein a current value provided by the first current source is greater than a current value provided by the second current source.

8. A temperature sensing method, comprising:
generating a first sensing signal corresponding to a temperature based on a first condition and generating a second sensing signal corresponding to the temperature based on a second condition different from the first condition via a sensor, wherein the first sensing signal is different from the second sensing signal;
performing a subtraction operation on the first sensing signal and the second sensing signal via a conversion circuit to obtain a result difference value;
calculating a compensation value according to the result difference value and the first sensing signal via the conversion circuit; and
performing a multiplication operation on the result difference value and the compensation value to obtain a multiplication value, subtracting the multiplication value from the first sensing signal to generate a first value, adding the multiplication value to the first sensing signal to generate a second value, dividing the first value by the second value to generate an output value, and converting the output value to an output digital code value,
wherein the second value is a constant.

9. The temperature sensing method of claim 8, wherein:
the first sensing signal has a first slope corresponding to the temperature,
the second sensing signal has a second slope corresponding to the temperature,
the first slope and the second slope are respectively negative values, and
an absolute value of the first slope is greater than an absolute value of the second slope.

10. The temperature sensing method of claim 9, wherein:
the multiplication value has an operation slope corresponding to the temperature, and
the operation slope is a negative value of the first slope.

11. The temperature sensing method of claim 8, wherein the step of performing the subtraction operation on the first sensing signal and the second sensing signal via the conversion circuit to obtain the result difference value comprises:
subtracting the first sensing signal from the second sensing signal via the conversion circuit to obtain the result difference value.

12. The temperature sensing method of claim 11, wherein the step of calculating the compensation value according to the result difference value and the first sensing signal via the conversion circuit comprises:
subtracting the first sensing signal from the constant value to obtain a reference difference value, and the reference difference value is divided by the result difference value to obtain the compensation value.

* * * * *